US008212150B2

(12) United States Patent
Kim et al.

(10) Patent No.: US 8,212,150 B2
(45) Date of Patent: Jul. 3, 2012

(54) ELECTROMAGNETIC INTERFERENCE NOISE REDUCTION BOARD USING ELECTROMAGNETIC BANDGAP STRUCTURE

(75) Inventors: Han Kim, Yongin-si (KR); Mi-Ja Han, Junjoo-si (KR); Dae-Hyun Park, Woolsan-si (KR); Hyo-Jic Jung, Daejeon-si (KR); Kang-Wook Bong, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 354 days.

(21) Appl. No.: 12/654,368

(22) Filed: Dec. 17, 2009

(65) Prior Publication Data

US 2011/0067915 A1    Mar. 24, 2011

(30) Foreign Application Priority Data

Sep. 22, 2009  (KR) .................. 10-2009-0089799

(51) Int. Cl.
*H05K 9/00* (2006.01)

(52) U.S. Cl. ........ 174/256; 174/262; 174/267; 361/763; 361/766; 361/784; 361/816; 361/818; 333/12; 333/22 R; 333/185; 343/700 MS; 343/909

(58) Field of Classification Search .......... 174/250–267, 174/359, 360, 376, 390, 392; 361/760–767, 361/780–785, 790–795, 816, 818, 118, 738; 333/12, 22 R, 167, 175, 185, 212, 245–247, 333/236, 238, 202–205; 343/700 MS, 909; 257/532, 665, 697, 724, 786
See application file for complete search history.

(56) References Cited

U.S. PATENT DOCUMENTS

| | | | | |
|---|---|---|---|---|
| 4,594,929 A * | 6/1986 | Behme et al. | | 83/715 |
| 6,002,593 A * | 12/1999 | Tohya et al. | | 361/765 |
| 6,091,310 A * | 7/2000 | Utsumi et al. | | 333/12 |
| 6,198,362 B1 * | 3/2001 | Harada et al. | | 333/12 |
| 6,215,372 B1 * | 4/2001 | Novak | | 333/12 |
| 6,329,604 B1 * | 12/2001 | Koya | | 174/255 |
| 6,353,540 B1 * | 3/2002 | Akiba et al. | | 361/794 |
| 6,365,828 B1 * | 4/2002 | Kinoshita et al. | | 174/359 |
| 6,512,181 B2 * | 1/2003 | Okubo et al. | | 174/255 |
| 6,798,666 B1 * | 9/2004 | Alexander et al. | | 361/766 |
| 6,833,512 B2 * | 12/2004 | Liu | | 174/262 |
| 6,949,707 B1 * | 9/2005 | Tonomura | | 174/390 |
| 6,967,282 B2 * | 11/2005 | Tonomura et al. | | 174/392 |
| 7,016,198 B2 * | 3/2006 | Fessler et al. | | 361/780 |
| 7,215,007 B2 * | 5/2007 | McKinzie et al. | | 257/664 |
| 7,215,301 B2 * | 5/2007 | Choi et al. | | 343/909 |
| 7,253,788 B2 * | 8/2007 | Choi et al. | | 343/909 |
| 7,405,698 B2 * | 7/2008 | de Rochemont | | 343/700 MS |
| 7,428,155 B2 * | 9/2008 | Nakao | | 361/794 |
| 7,466,560 B2 * | 12/2008 | Hayashi et al. | | 361/784 |
| 7,505,285 B2 * | 3/2009 | Osaka | | 361/788 |
| 7,586,444 B2 * | 9/2009 | Berlin et al. | | 343/700 MS |

(Continued)

*Primary Examiner* — Michail V Datskovskiy

(57) ABSTRACT

An EMI noise reduction board is disclosed. The electromagnetic interference (EMI) noise reduction board having an electromagnetic bandgap structure for shielding a noise includes: a first area having a ground layer and a power layer; a second area placed in a side portion of the first area having an electromagnetic bandgap structure therein. The electromagnetic bandgap structure includes: a plurality of first conductive plates and a plurality of second conductive plates placed on a same planar surface along the side portion of the first area; and a stitching via configured to electrically connect the first conductive plate to the second conductive plate through a planar surface that is different from the first conductive plate and the second conductive plate.

8 Claims, 21 Drawing Sheets

U.S. PATENT DOCUMENTS

| | | | |
|---|---|---|---|
| 7,592,957 B2 * | 9/2009 | Achour et al. | 343/700 MS |
| 7,594,105 B2 * | 9/2009 | Ohsaka | 713/2 |
| 7,675,729 B2 * | 3/2010 | Anthony et al. | 361/118 |
| 7,843,702 B2 * | 11/2010 | Choi et al. | 361/763 |
| 7,889,134 B2 * | 2/2011 | McKinzie et al. | 343/700 MS |
| 7,944,320 B2 * | 5/2011 | Han et al. | 333/12 |
| 8,004,369 B2 * | 8/2011 | Kwon et al. | 333/12 |
| 8,102,219 B2 * | 1/2012 | Koo et al. | 333/12 |
| 8,125,290 B2 * | 2/2012 | Wu et al. | 333/12 |
| 2005/0104678 A1 * | 5/2005 | Shahparnia et al. | 333/12 |
| 2005/0134522 A1 * | 6/2005 | Waltho | 343/909 |
| 2005/0194169 A1 * | 9/2005 | Tonomura | 174/35 R |
| 2005/0205292 A1 * | 9/2005 | Rogers et al. | 174/255 |
| 2006/0050010 A1 * | 3/2006 | Choi et al. | 343/909 |
| 2006/0050491 A1 * | 3/2006 | Hayashi et al. | 361/760 |
| 2006/0092093 A1 * | 5/2006 | Choi et al. | 343/909 |
| 2007/0001926 A1 * | 1/2007 | Waltho | 343/909 |
| 2007/0090398 A1 * | 4/2007 | McKinzie, III | 257/192 |
| 2007/0136618 A1 * | 6/2007 | Ohsaka | 713/323 |
| 2007/0228578 A1 * | 10/2007 | Chou | 257/774 |
| 2009/0011922 A1 * | 1/2009 | de Rochemont | 501/137 |
| 2009/0038840 A1 * | 2/2009 | Kim et al. | 174/376 |
| 2009/0039984 A1 * | 2/2009 | Kim et al. | 333/212 |
| 2009/0040741 A1 * | 2/2009 | Hayashi et al. | 361/794 |
| 2009/0048917 A1 * | 2/2009 | Blake et al. | 705/14 |
| 2009/0080172 A1 * | 3/2009 | Arslan et al. | 361/816 |
| 2009/0135570 A1 * | 5/2009 | Chou et al. | 361/782 |
| 2009/0145646 A1 * | 6/2009 | Han et al. | 174/260 |
| 2009/0184782 A1 * | 7/2009 | Koo et al. | 333/204 |
| 2009/0236141 A1 * | 9/2009 | Kim et al. | 174/360 |
| 2009/0267704 A1 * | 10/2009 | Chang et al. | 333/175 |
| 2009/0278626 A1 * | 11/2009 | Lee | 333/185 |
| 2009/0315648 A1 * | 12/2009 | Toyao | 333/238 |
| 2009/0322450 A1 * | 12/2009 | Kim et al. | 333/204 |
| 2010/0108373 A1 * | 5/2010 | Park | 174/376 |

* cited by examiner

ELECTROMAGNETIC INTERFERENCE NOISE REDUCTION BOARD USING ELECTROMAGNETIC BANDGAP STRUCTURE

CROSS-REFERENCE TO RELATED APPLICATIONS

This application claims the benefit of Korean Patent Application No. 10-2009-0089799, filed with the Korean Intellectual Property Office on Sep. 22, 2009, the disclosure of which is incorporated herein by reference in its entirety.

BACKGROUND

1. Technical Field

The present invention relates to a board, more specifically to a noise reduction board that can reduce an EMI noise by use of an electromagnetic bandgap structure.

2. Description of the Related Art

As the operating frequencies of electric products become higher, electromagnetic interference (EMI) has been perceived as a chronic noise problem. Particularly, the operating frequencies of electronic products have reached a few ten megahertzs (MHz), or even a few gigahertzs (GHz), making the EMI problems more serious. Subsequently, finding a solution to the problems is desperately needed. Among the EMI problems occurring at a board, a solution for the noise problems particularly occurred at the edge of the board has been studied little, making it difficult to completely shield the noise at, the board.

EMI noise refers to a noise that creates a noise problem caused by interference when an electromagnetic (EM) wave generated in one electrical circuit, component or part is transferred to another electrical circuit, component or part. The EMI noise can be broadly categorized into two types, namely, a radiation noise (reference numerals 10 and 30 in FIG. 1) and a conduction noise (reference numeral 20 in FIG. 1).

The radiation noise 10, which is radiated towards an upper side of the board (that is, the mounting surface of an electronic part), may be commonly shielded by covering an upper portion of the board by use of an electromagnetic shielding cap, for example, a metal cap. However, few studies have tried to find an effective solution for the radiation noise 30 (hereinafter, referred to as an "edge noise"), which is radiated towards the outside of the board when a conduction noise 20 inside the board is conducted to the edge of the board.

If a technology is developed to reduce the edge noise at the edge of the board through a simple modification of the board structure, it is expected to significantly reduce the development time and costs, compared to the conventional method, which has tried to solve the problem through the use of a metal cap or a circuit. Additionally, such technology can have more merits in terms of space utilization and power consumption, and can easily remove a noise in a frequency band of a few gigahertzs (GHz), making it effective in solving the EMI noise problem at the edge of the board.

SUMMARY

The present invention provides an electromagnetic interference (EMI) noise reduction board that can shield the radiation noise radiated from the edge of the board, by inserting an electromagnetic bandgap structure capable of shielding a noise ranging a certain frequency band into a portion of the board corresponding to the edge of the board.

The present invention also provides an EMI noise reduction board that can be advantages in space utilization, production cost and power consumption, by simply modifying the structure of the board so as to easily shield the radiation noise radiated from the edge of the board.

Other problems that the present invention solves will become more apparent through the embodiments described below.

An aspect of the present invention features an electromagnetic interference (EMI) noise reduction board having an electromagnetic bandgap structure for shielding a noise, including: a first area having a ground layer and a power layer; a second area placed in a side portion of the first area having an electromagnetic bandgap structure therein. The electromagnetic bandgap structure can include a plurality of first conductive plates and a plurality of second conductive plates placed on a same planar surface along the side portion of the first area, and a stitching via configured to electrically connect the first conductive plate and the second conductive plate through a planar surface that is different from the first conductive plate and the second conductive plate.

The stitching via can include: a connection pattern, placed on a planar surface that is different from the conductive plates; a first via, configured to electrically connect one side of the connection pattern and the first conductive plates; and a second via, configured to electrically connect another side of the connection pattern and the second conductive plate.

In addition, the first area can include: a first metal layer arranged on a same planar surface as that of the connection pattern; and a second metal layer arranged on a same planar surface as that of the first conductive plates and the second conductive plates. The first metal layer is expanded to the second area to surround the connection pattern.

The first area and the second area can be a multi-layer having 4 or more layers, and at least one of the first via and the second via can be a penetration via that penetrates the second area vertically.

Also, at least one of the first via and the second via can be a blind via.

At least one of the first conductive plate and the second conductive plate can have a bump or an indentation shape corresponding to an outline shape of the first area, and the second area can be selectively arranged on a certain portion of the side portion of the first area.

Additional aspects and advantages of the present invention will be set forth in part in the description which follows, and in part will be obvious from the description, or may be learned by practice of the invention.

DETAILED DESCRIPTION

Figure 1:
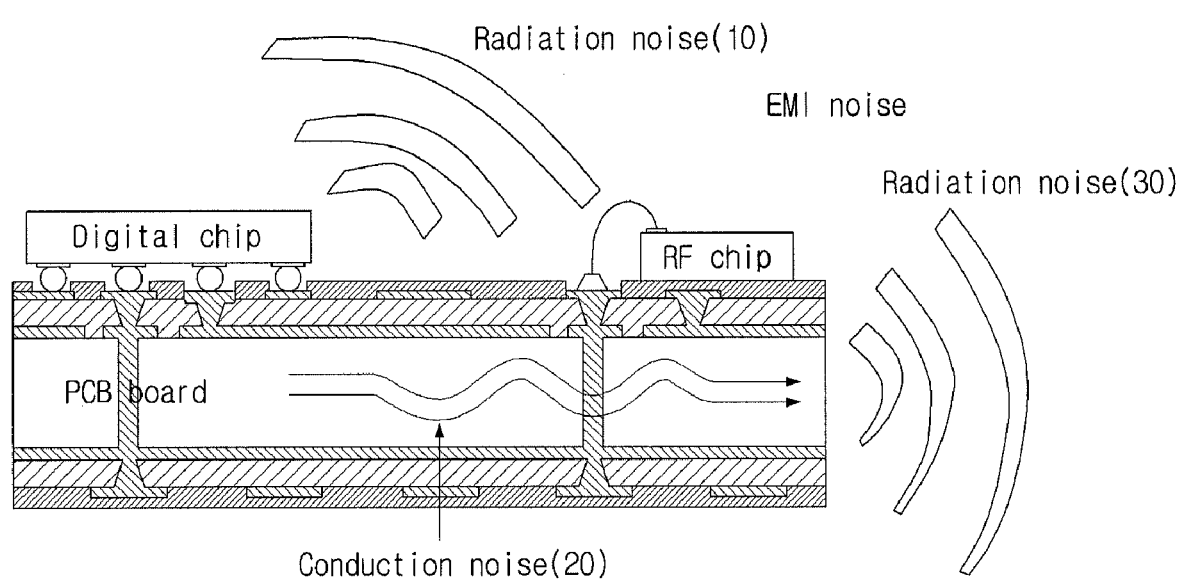
FIG. 1 is a drawing for describing an electromagnetic interference (EMI) noise problem.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention.

In the description of the present invention, certain detailed descriptions of related art are omitted when it is deemed that they may unnecessarily obscure the essence of the invention.

While such terms as "first" and "second," etc., may be used to describe various components, such components must not be limited to the above terms. The above terms are used only to distinguish one component from another. For example, a first component may be referred to as a second component without departing from the scope of rights of the present invention, and likewise a second component may be referred to as a first component.

Figure 2:
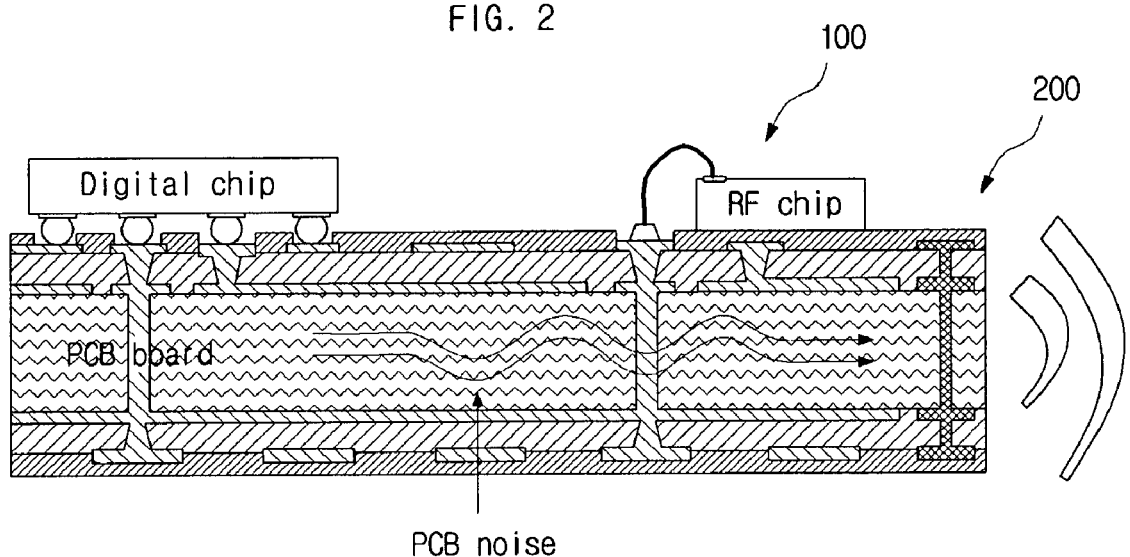
FIG. 2 is a sectional view of an EMI noise reduction board according to an embodiment of the present invention.

The object of an EMI noise reduction board according to an embodiment of the present invention is not to shield a conductive noise inside the board but to prevent the conductive noise that is conducted to the edge of the board from being radiated to the outside of the board. For this, as shown in FIGS. 2 and 3, a printed circuit board according to an embodiment of the present invention includes: the first area 100 having metal layers 110, 120, 130 and 140, such as a ground layer 110 in FIG. 3 and a power layer 120 in FIG. 3; and the second area 200 placed in a side portion of the first area 100 having an electromagnetic bandgap structure (hereinafter "EBG structure") therein.

Figure 5:
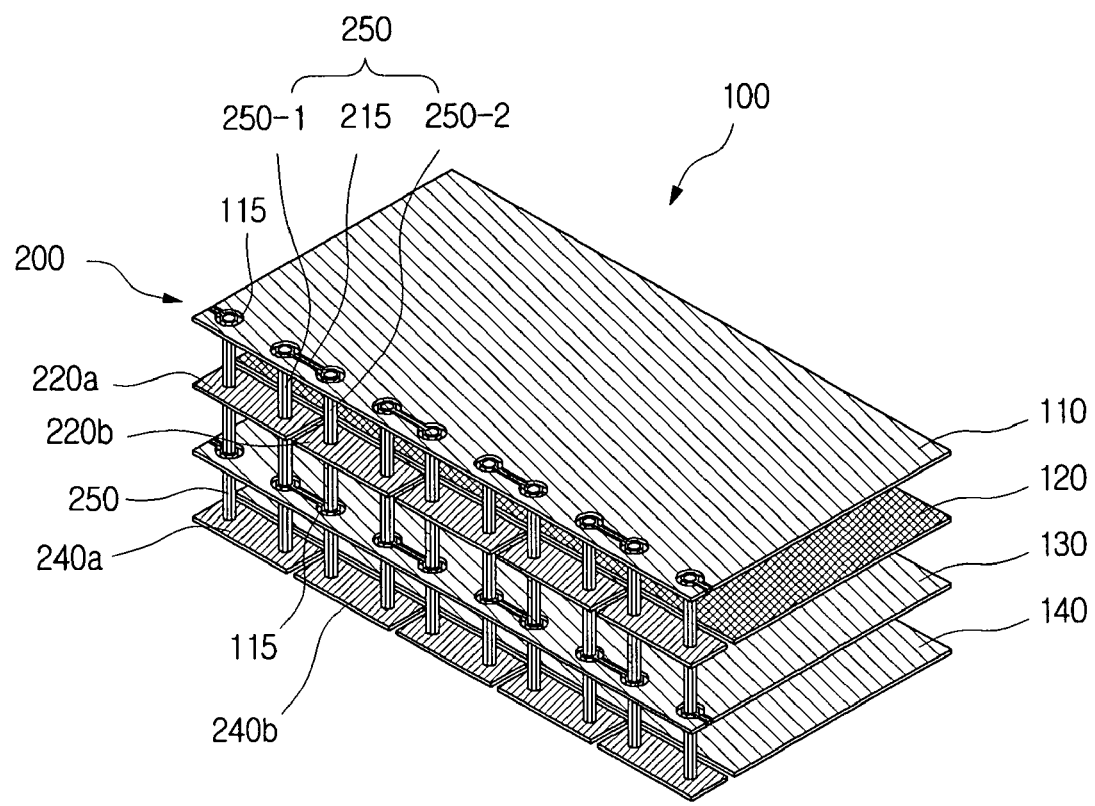
FIG. 5 is a perspective view of an EMI noise reduction board according to an embodiment of the present invention.

As shown in FIG. 5, the EBG structure includes a plurality of first conductive plates 220a placed along the side portion of the first area 100 on a same planar surface, a second conductive plate 220b, and a stitching via 250 configured to electrically connect the first conductive plate 220a and the second conductive plate 220b through a planar surface that is different from the first conductive plate 220a and the second conductive plate 220b. Here, the first conductive plate and the second conductive plate are not used to indicate a conductive plate configured to perform a specific function, but to distinguish conductive plates that are arranged on a same planar surface and adjacent to each other.

As mentioned above, the conductive plates 220a, 220b, 240a and 240b (hereinafter collectively referred to as 220 and 240) and a dielectric (not shown), which is interposed between the conductive plates 220, 240 constitute a capacitance component, and the vias 250-1, 250-2 constitute an inductance component. The EBG structure for shielding a noise, namely, an L-C filter is constituted by combination of the capacitance component and the inductance component.

Figure 3:
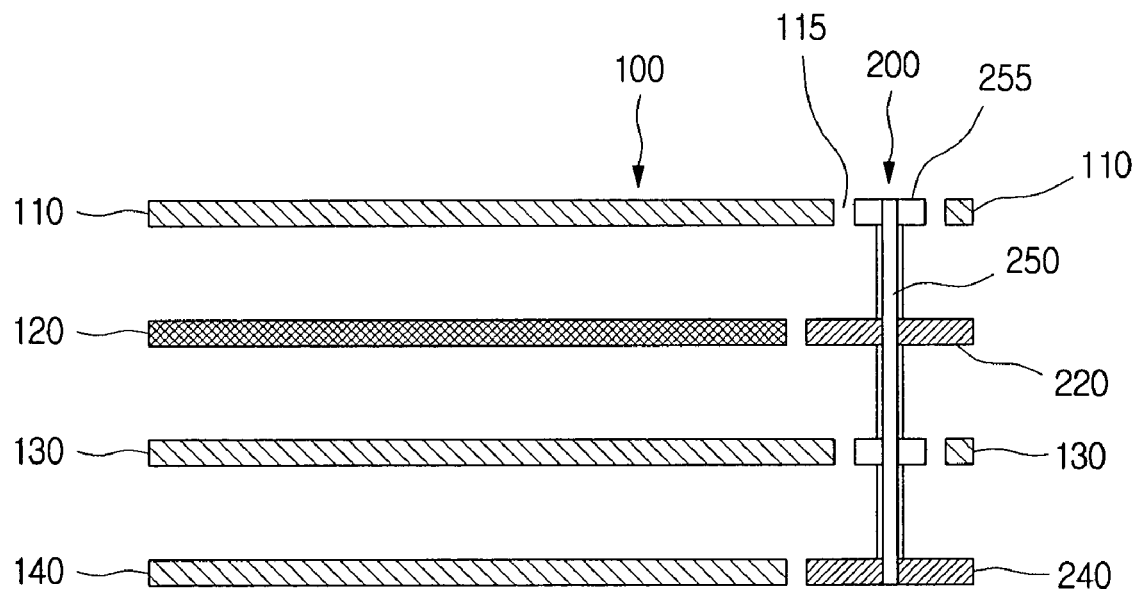
FIG. 3 is a side view of an EMI noise reduction board according to an embodiment of the present invention.
Figure 4:
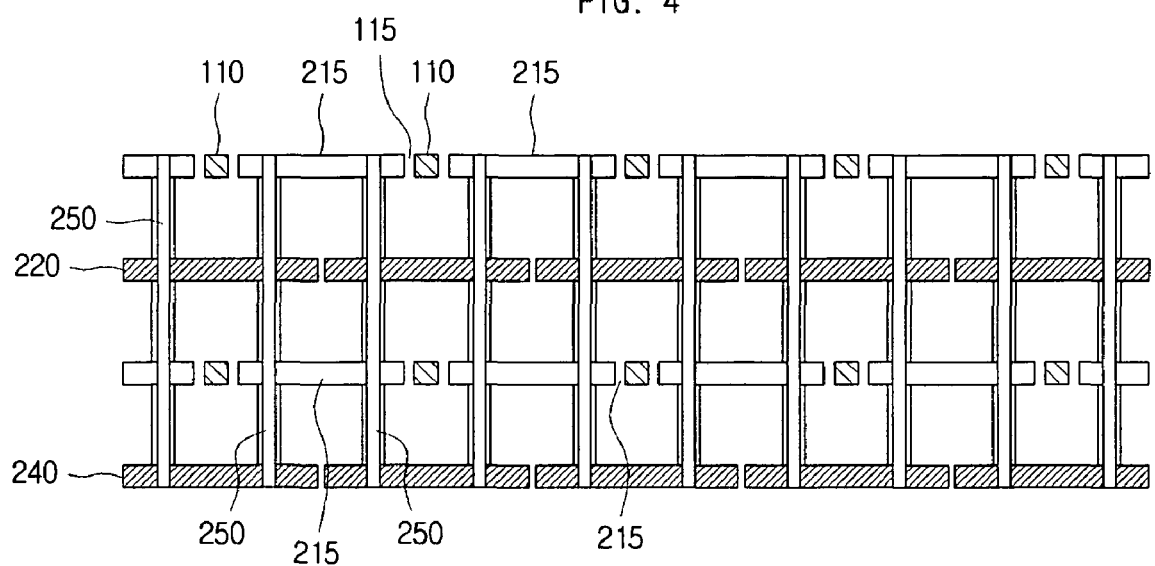
FIG. 4 is a front view of an EMI noise reduction board according to an embodiment of the present invention.

As shown in FIGS. 3 to 5, the printed circuit board according to an embodiment of the present invention has a structure of shielding an EMI noise radiated from the side portion of the board by forming the conductive plates 220, 240, which are separated from one another, on a layer of the edge portion of the board and connecting plates by stitching vias 250.

Figure 6:
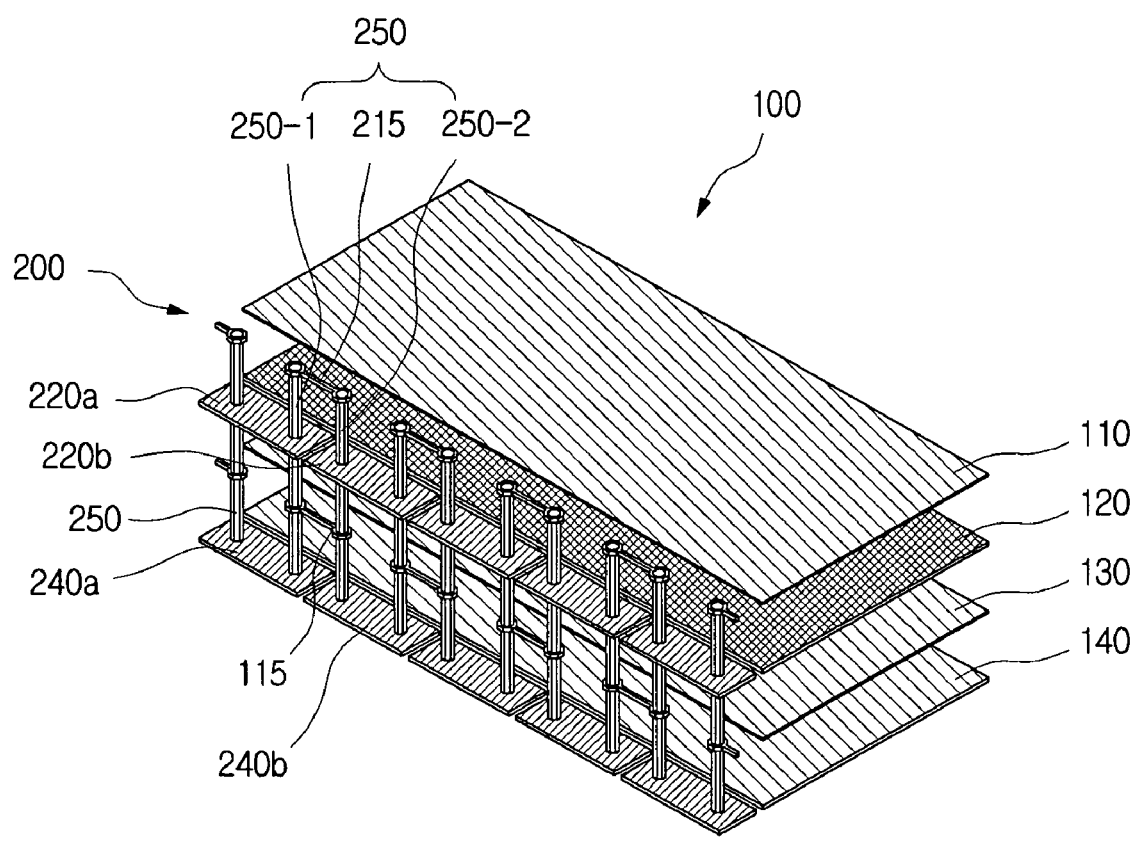
FIG. 6 is a perspective view of an EMI noise reduction board according to another embodiment of the present invention.

A plurality of metal layers 110, 120, 130 and 140, such as the ground layer 110 and the power layer 120, are provided on the first area 100. FIG. 3 shows a structure in which the ground layer 110 is provided on a top layer and the power layer 120 is provided below the ground layer 110. Here, the ground layer 110 and the power layer 120 are electrically separated from the EBG structure, which is provided on the second area 200. Namely, as shown in FIG. 5, the ground layer 110 is separated from a connection pattern 215 through a clearance hole 115, and the power layer 120 is electrically separated by being placed separately from the conductive plates 220. Meanwhile, as shown in FIG. 6, metal layers 110, 130 placed on a planar surface where the connection pattern 215 is placed can be separated from the connection patter 215 by not being extended to the second area 200.

Two layers 130, 140 provided below the power layer 120 are electrically separated from the EBG structure, like the ground layer 110 and the power layer 120. An insulator or a dielectric is interposed between the layers.

In addition, as shown in FIGS. 3 to 5, it is possible to arrange the conductive plates 220 on the second area placed on the same planar surface where the power layer is placed, in order to shield the noise radiated toward the side portion.

However, the configuration of the first area 100 as described above is just an example, and thus the configuration and arrangement of the first area 100 can be changed in various ways.

The plurality of conductive plates 220, 240 are arranged to be overlapped to one another on the second area 200 placed on the side portion, namely, the edge portion of the first area 100 in which the ground layer 110 and the power layer are provided, as shown in FIGS. 3 and 5. In more detail, the plurality of conductive plates 220 are arranged on one planar surface along the side portion of the first area 100, and the conductive plates 220 are arranged on another planar surface along the side portion of the first area 100.

The conductive plates 220a, 220b that are arranged on the same planar surface and adjacent to each other are electrically connected to each other by the stitching via 250 passing through a planar surface that is different from the plates. Here, the stitching via 250 includes: the connection pattern 215, placed on a planar surface that is different form the conductive plates 220a, 220b to be connected; the first via 250-1 configured to electrically connect one side of the connection pattern 215 and one conductive plate 220a; and the second via 250-2 configured to electrically connect another side of the connection pattern 215 and another conductive plate 220b.

Conductive plates 220a, 220b that are provided on the top layer as shown in FIGS. 3 to 5 are mostly described, but it is also possible to apply the same structure to the conductive plates 240a, 240b that are provided on the bottom layer. Namely, the conductive plates 240a, 240b that are provided on the bottom layer can be also electrically connected to each other by the stitching via 250. The same applies to the below description.

As shown in FIGS. 3 to 5, when the first area 100 and the second area 200 are a multi-layer with 4 or more layers, the conductive plates 220, 240 that are arranged on different planar surfaces are arranged on the portion where the conductive plates are overlapped, and the first via 250-1 and/or the second via 250-2 can penetrate the second area 200 vertically to connect the conductive plates 220 240, which are arranged on different planar surfaces, to each other.

Namely, the conductive plates 220 are overlapped with conductive plates 240 on different layers so that it is relatively easy to implement interlayer connection by using the penetration vias 250-1, 250-2 that penetrate the second area 200 vertically. Moreover, it is advantageous to repeatedly form the EGB structure over and below one another and to simplify the manufacturing process so that total manufacturing cost can be reduced.

Meanwhile, the metal layers 110, 130 of the first area 100, which are arranged on the same planar surface on which the connection pattern 215 is arranged, can be expanded to the second area 200 to encompass the connection pattern 215. In this case, as described above, the metal layers 110, 130 and the connection pattern 215 can be electrically separated by the clearance hole 115.

Each of the conductive plates 210, 220, 230, 240 can have the same size and shape, but it is also possible to have a different size or shape, as required by design, if necessary. Moreover, although it is not shown, an insulator or a dielectric for an interlayer isolation is interposed between the conductive plates 220, 240.

Although the aforementioned embodiments show a structure of using penetration vias 250-1, 250-2, which penetrate the second area 200, to electrically connect each of conductive plates 220, 240 on the second area 200, it is also possible for conductive plates 220, 240 to be respectively connected by a blind via 250a, as shown in FIGS. 7 to 17.

Figure 7:
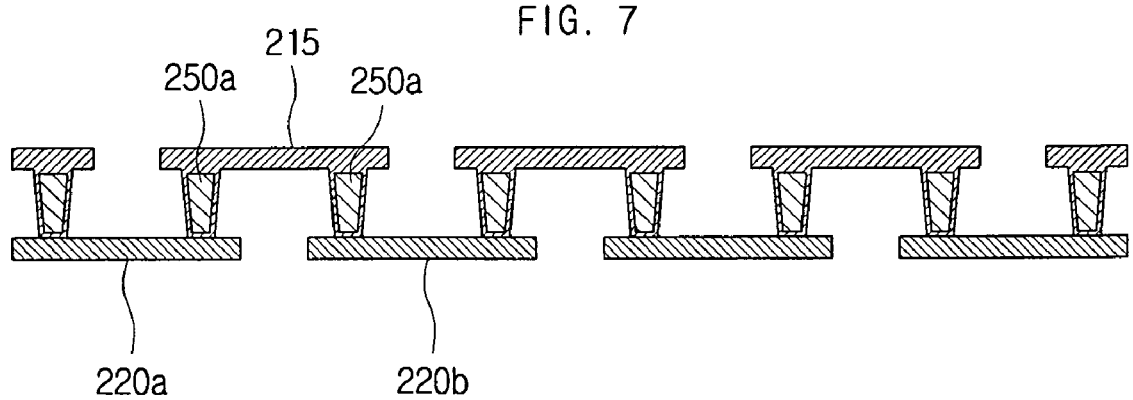
FIGS. 7 to 17 are front views of EMI noise reduction boards according to various embodiments of the present invention.
Figure 8:
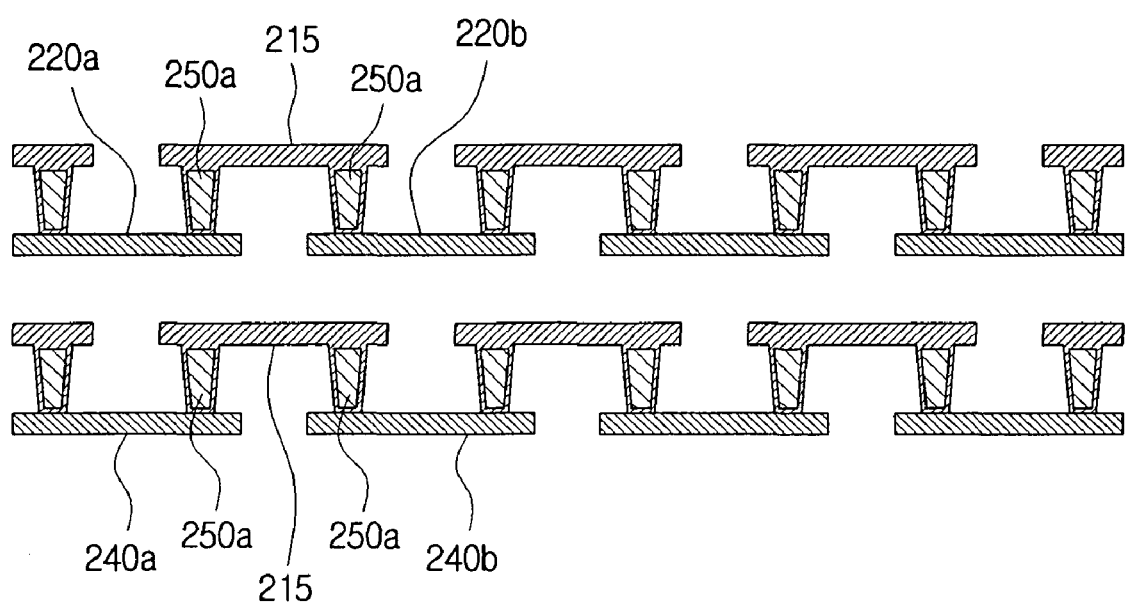

FIG. 7 shows a 2-layered EBG structure. In this case, the conductive plates 220a, 220b in the second area are connected repeatedly to one another by the blind via 250a and the connection pattern 215. FIG. 8 shows a 4-layered EBG structure having vertically repeated structures in FIG. 7. However, in this case, the vertical structure, that is, the vertical conductive plates 220a, 240a, is electrically separated.

Figure 9:
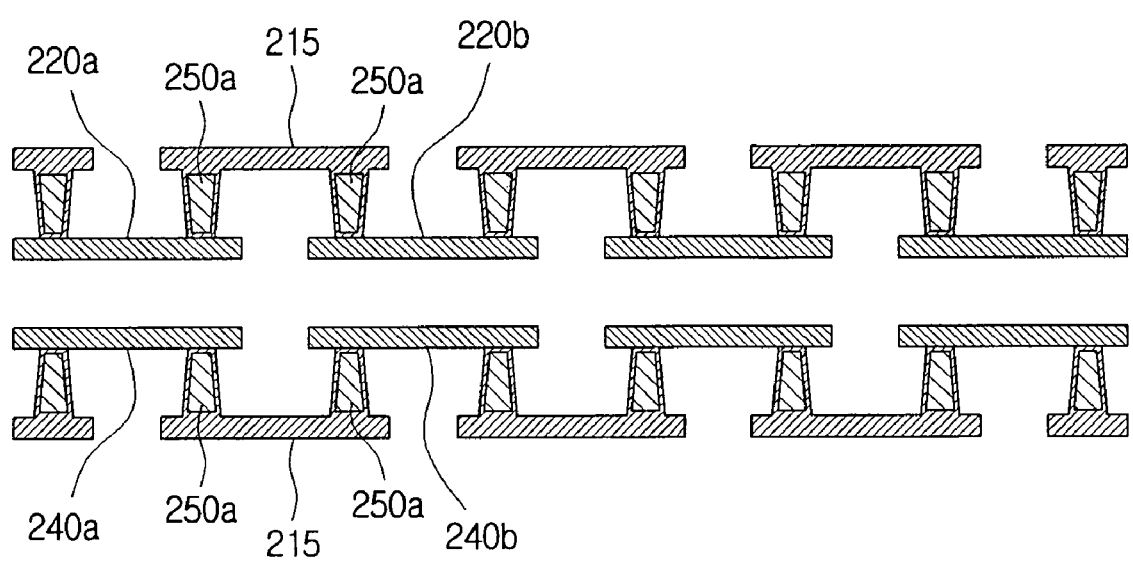
Figure 10:
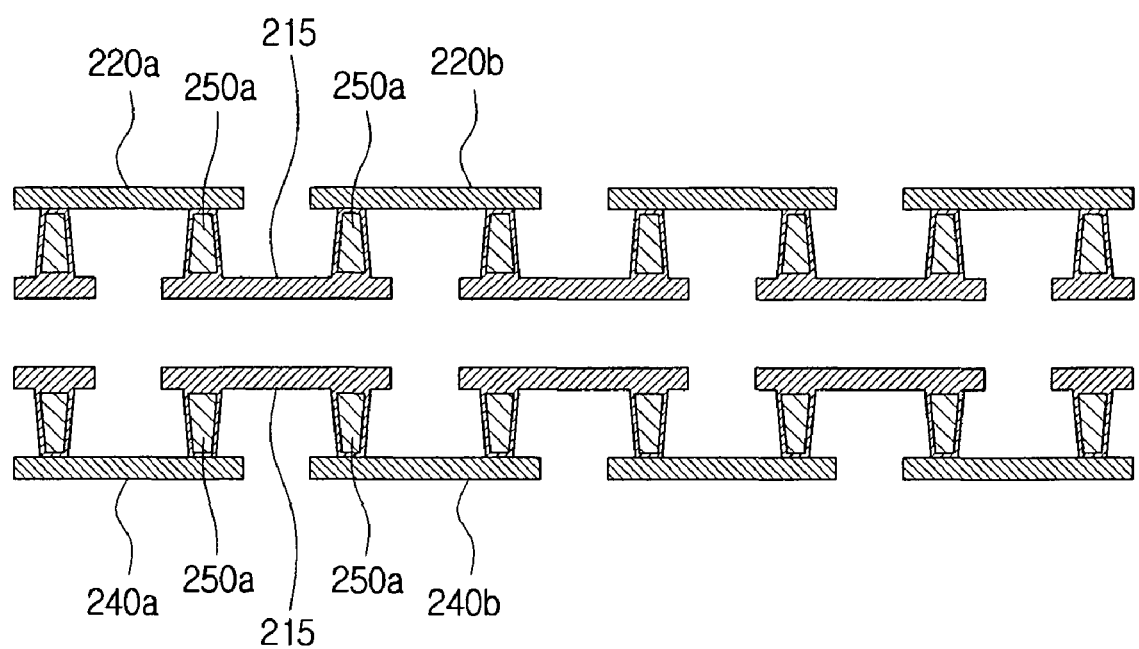
Figure 11:
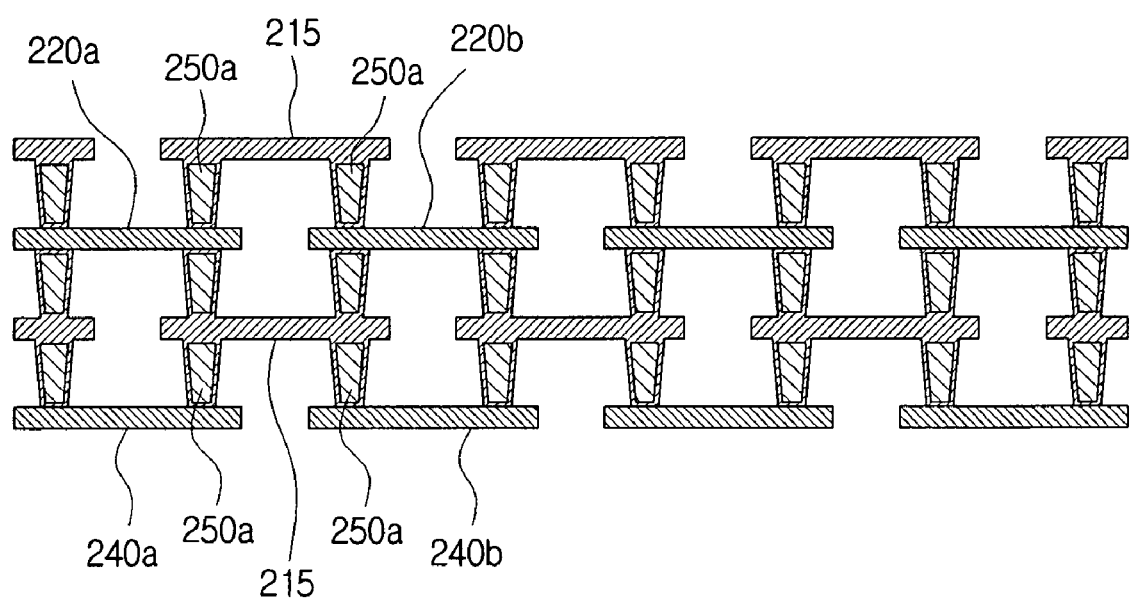
Figure 12:
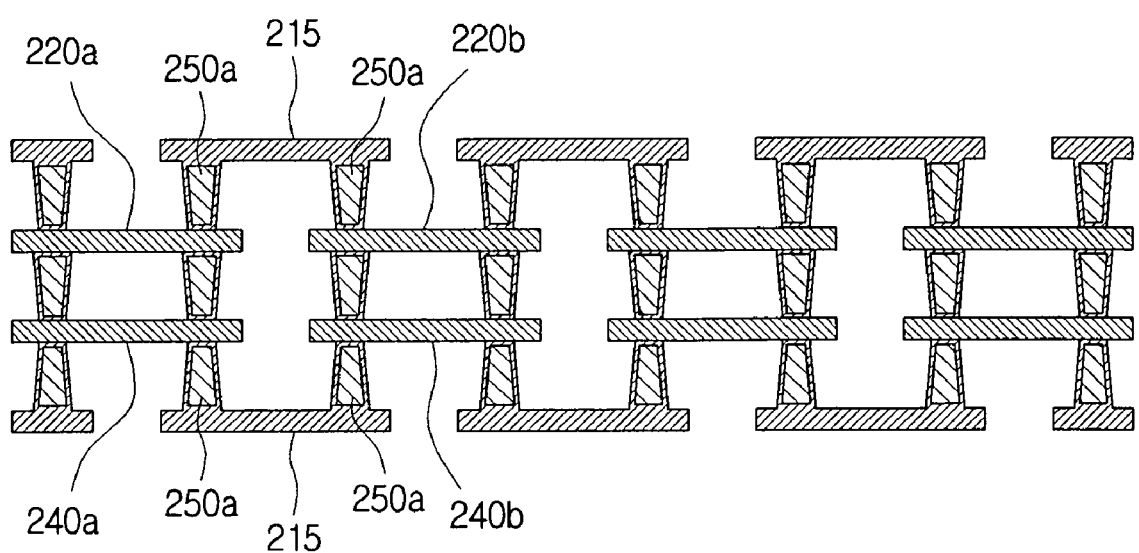
Figure 13:
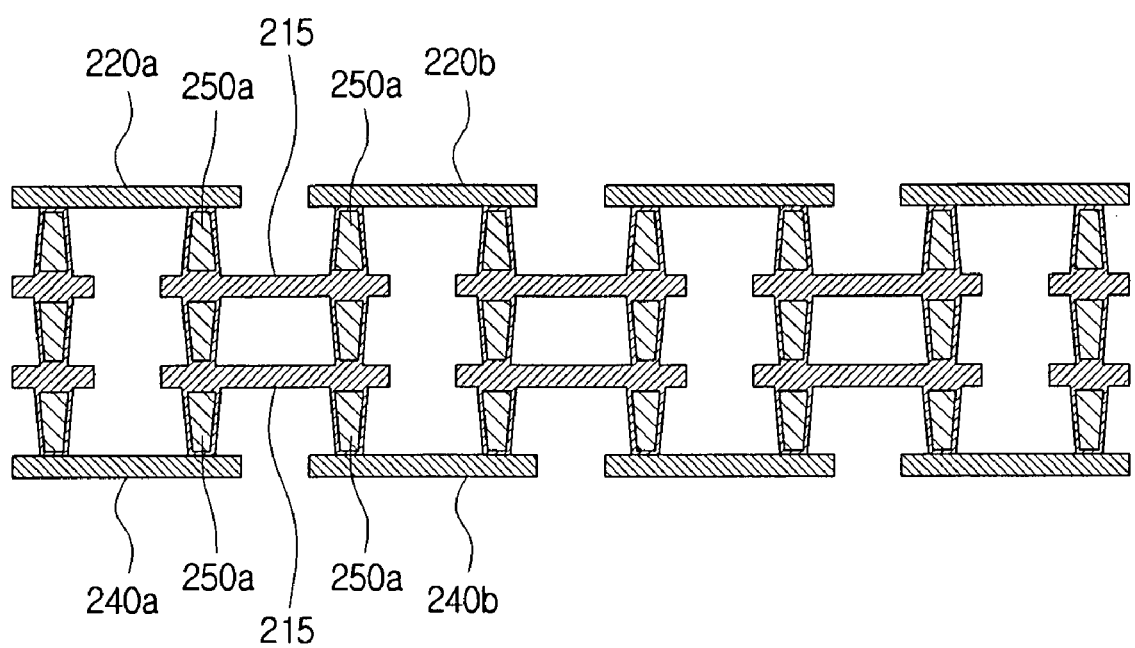
Figure 14:
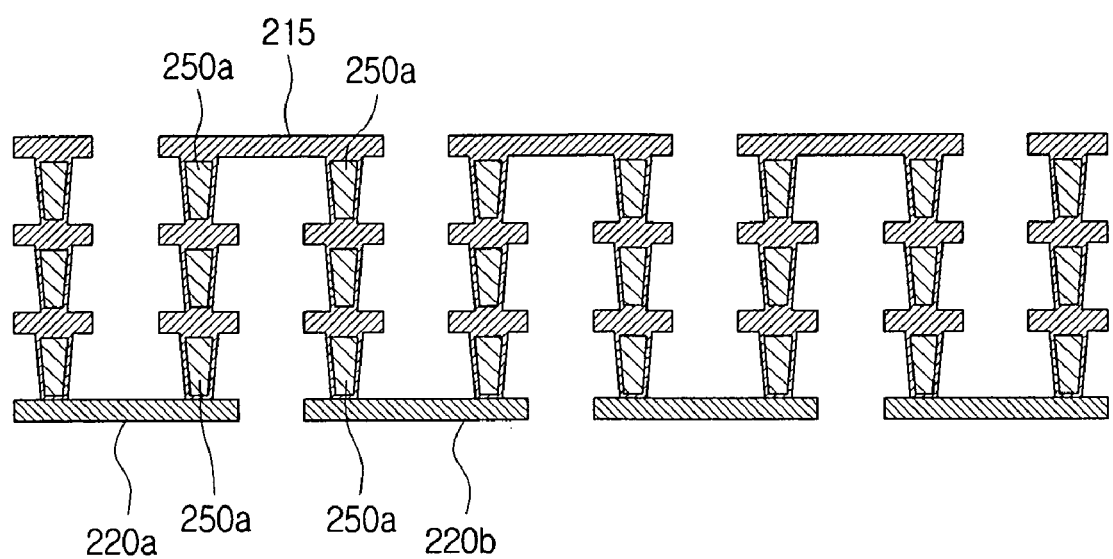
Figure 15:
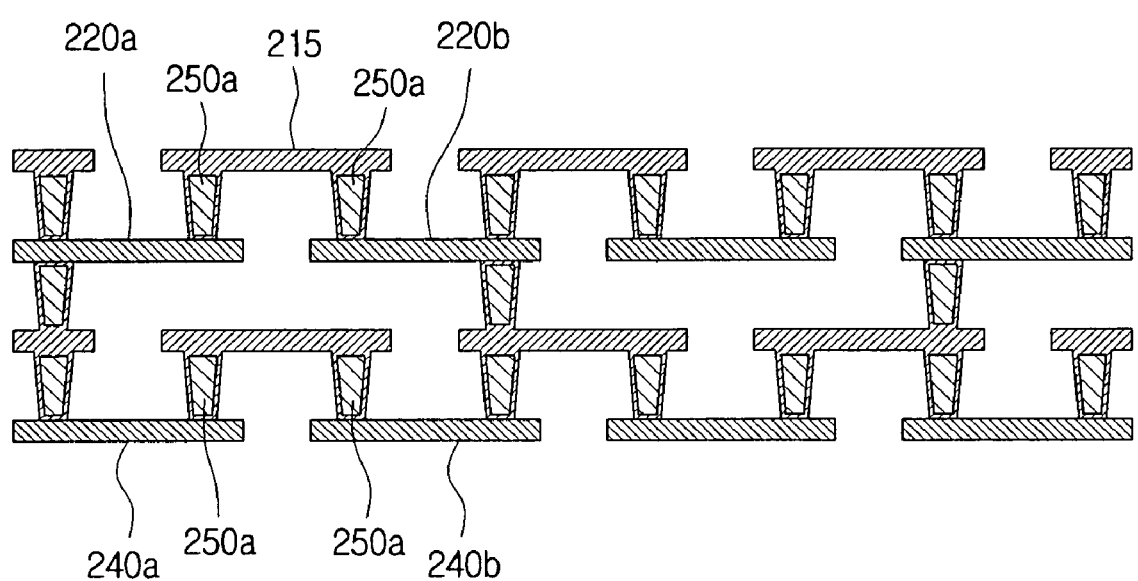
Figure 16:
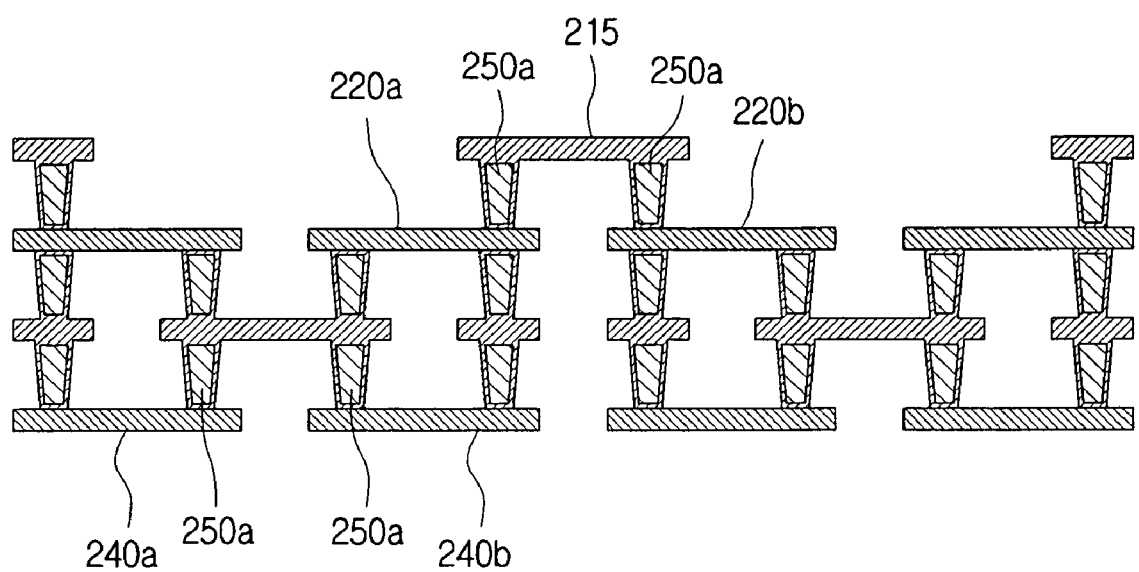
Figure 17:
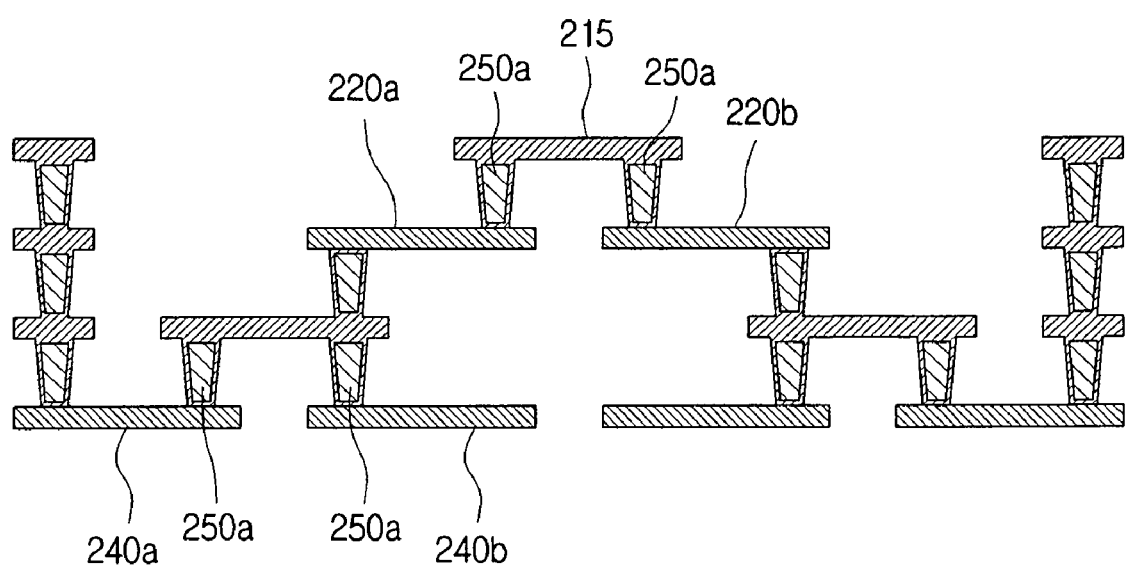

FIG. 9 shows a 4-layered EBG structure having vertically repeated structures shown in FIG. 7, but the top and bottom conductive plates 220a, 240a are arranged to face one another, and FIG. 10 shows a 4-layered EBG structure of which top and bottom connection patterns 215 are arranged to face one another.

Meanwhile, as shown in FIGS. 11 to 17, the top and bottom conductive plates 220a, 240a can be connected to one another by the blind via 250a. The structures and positions of connecting the top and bottom conductive plates can vary, as shown in FIGS. 11 to 17.

Figure 18:
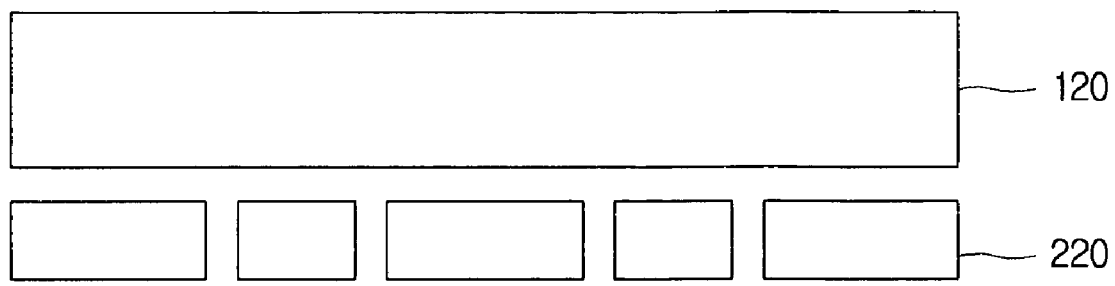
FIGS. 18 to 21 are plan views of EMI noise reduction boards according to various embodiments of the present invention.
Figure 19:
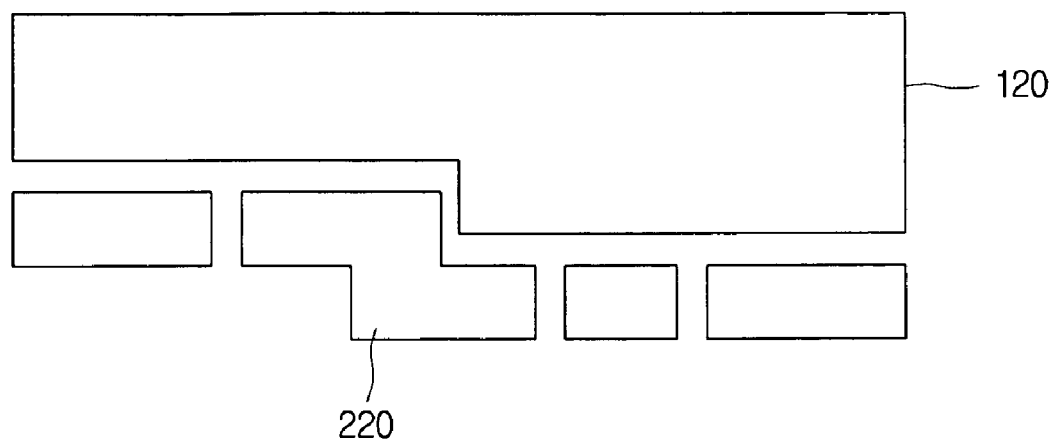
Figure 20:
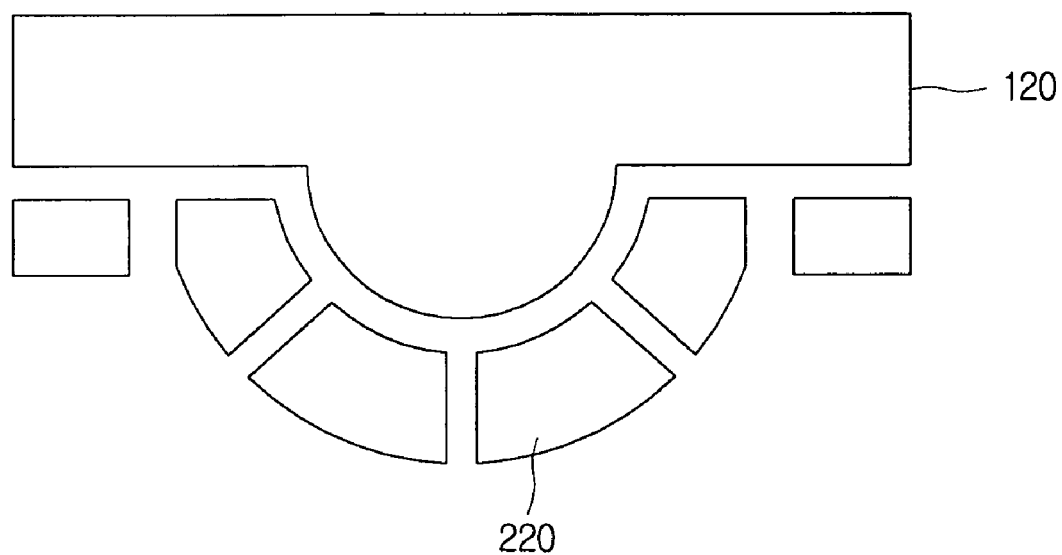
Figure 21:
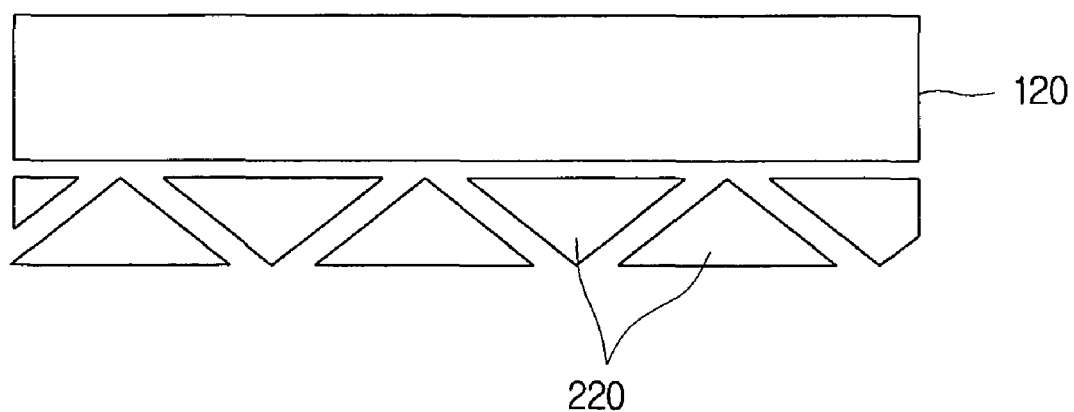

In addition, as shown in FIG. 18, when the side portion of the first area 100 has a rectangular shape, the conductive plates 220 in the second area 200 also has a rectangular shape, but when the first area 100 has a shape other than a rectangle, as shown in FIGS. 19 to 21, the conductive plates 220 in the second area 200 also have an outline that can be a bump or an indentation in various shapes corresponding to the first area 100. Namely, the conductive plates 220 can have a bent shape, as shown in FIG. 19, a curved shape, as shown in FIG. 20, or a repeated triangular shape, as shown FIG. 21.

Meanwhile, the second area 200 into which the EBG structure is inserted can be arranged on the whole side portion of the first area 100, but it is also possible to be selectively arranged on a certain portion. By arranging the second area 200 on a certain portion, it is possible to selectively shield the noise from the desired portion, thereby reducing the manufacturing cost.

While the spirit of the present invention has been described in detail with reference to particular embodiments, the embodiments are for illustrative purposes only and shall not limit the present invention. It is to be appreciated that those skilled in the art can change or modify the embodiments without departing from the scope and spirit of the present invention.

What is claimed is:

1. An electromagnetic interference (EMI) noise reduction board having an electromagnetic bandgap structure for shielding a noise, comprising:
    a first area having a ground layer and a power layer; and
    a second area placed in a side portion of the first area and having an electromagnetic bandgap structure therein so as to shield an EMI noise radiated to the outside through the side portion of the first area,
    wherein the electromagnetic bandgap structure comprises:
    a plurality of first conductive plates and a plurality of second conductive plates placed on a same planar surface along the side portion of the first area; and
    a stitching via configured to electrically connect the first conductive plates and the second conductive plates through a planar surface that is different from the first conductive plates and the second conductive plates.

2. The EMI noise reduction board of claim 1, wherein the stitching via comprises:
    a connection pattern, placed on a planar surface that is different form the first conductive plate and the second conductive plate;
    a first via, configured to electrically connect one side of the connection pattern to the first conductive plates; and
    a second via, configured to electrically connect the other side of the connection pattern to the second conductive plate.

3. The EMI noise reduction board of claim 2, wherein the first area comprises:
    a first metal layer arranged on a same planar surface as that of the connection pattern; and
    a second metal layer arranged on a same planar surface as that of the first conductive plate and the second conductive plates,
    wherein the first metal layer is expanded to the second area to surround the connection pattern.

4. The EMI noise reduction board of claim 2, wherein the first area and the second area are a multi-layer having 4 or more layers, and at least one of the first via and the second via is a penetration via that penetrates the second area vertically.

5. The EMI noise reduction board of claim 2, wherein at least one of the first via and the second via is a blind via.

6. The EMI noise reduction board of claim 1, wherein at least one of the first conductive plate and the second conductive plate has a bump or an indentation shape corresponding to an outline shape of the first area.

7. The EMI noise reduction board of claim 1, wherein the second area is selectively arranged in a certain portion of the side portion of the first area.

8. The EMI noise reduction board of claim 1, wherein the first conductive plate and the second conductive plate are arranged on a same planar surface as that of the power layer.

* * * * *

UNITED STATES PATENT AND TRADEMARK OFFICE
CERTIFICATE OF CORRECTION

| | | |
|---|---|---|
| PATENT NO. | : 8,212,150 B2 | Page 1 of 1 |
| APPLICATION NO. | : 12/654368 | |
| DATED | : July 3, 2012 | |
| INVENTOR(S) | : Han Kim et al. | |

It is certified that error appears in the above-identified patent and that said Letters Patent is hereby corrected as shown below:

Column 6, Line 25, In Claim 2, delete "form" and insert -- from --, therefor.

Signed and Sealed this
Sixteenth Day of October, 2012

David J. Kappos
*Director of the United States Patent and Trademark Office*